United States Patent
Lee et al.

(10) Patent No.: US 9,306,189 B2
(45) Date of Patent: Apr. 5, 2016

(54) ORGANIC LIGHT EMITTING DISPLAY DEVICE AND MANUFACTURING METHOD THEREOF

(71) Applicant: SAMSUNG DISPLAY CO., LTD., Yongin, Gyeonggi-Do (KR)

(72) Inventors: Hyun-Shik Lee, Incheon (KR); Kyu-Seok Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 46 days.

(21) Appl. No.: 13/946,867

(22) Filed: Jul. 19, 2013

(65) Prior Publication Data

US 2014/0183462 A1 Jul. 3, 2014

(30) Foreign Application Priority Data

Jan. 2, 2013 (KR) ......................... 10-2013-0000109

(51) Int. Cl.
*H01L 51/52* (2006.01)

(52) U.S. Cl.
CPC ........ *H01L 51/5262* (2013.01); *H01L 51/5253* (2013.01); *H01L 51/5256* (2013.01); *H01L 51/5275* (2013.01)

(58) Field of Classification Search
USPC ......................................................... 257/40
See application file for complete search history.

(56) References Cited

U.S. PATENT DOCUMENTS

| | | | |
|---|---|---|---|
| 2007/0284601 A1* | 12/2007 | Khanarian | H01L 33/22 257/98 |
| 2009/0004375 A1 | 1/2009 | Kim et al. | |
| 2009/0015757 A1* | 1/2009 | Potts | B82Y 20/00 349/69 |
| 2009/0302744 A1 | 12/2009 | Kim et al. | |
| 2011/0204388 A1* | 8/2011 | Jeong | H01L 51/5281 257/88 |
| 2011/0233570 A1 | 9/2011 | Lee et al. | |
| 2012/0097640 A1 | 4/2012 | Asakawa et al. | |
| 2012/0326194 A1* | 12/2012 | Son | H01L 51/5259 257/98 |

FOREIGN PATENT DOCUMENTS

| | | |
|---|---|---|
| KR | 10-2009-0001371 | 1/2009 |
| KR | 10-2009-0126597 | 12/2009 |
| KR | 10-2011-0106733 | 9/2011 |
| KR | 10-2012-0024599 | 3/2012 |

* cited by examiner

*Primary Examiner* — Zandra Smith
*Assistant Examiner* — Lawrence Tynes, Jr.
(74) *Attorney, Agent, or Firm* — Lewis Roca Rothgerber Christie LLP

(57) ABSTRACT

An organic light emitting display device, including: a substrate; a display unit formed on the substrate; and an encapsulation layer formed on the display unit, in which the encapsulation layer includes a lower layer formed on the display unit, at least one pattern layer formed on the lower layer, and an upper layer formed on the pattern layer, and the lower layer includes at least one of an inorganic film and an organic film, and the pattern layer includes an uneven pattern having a plurality of protrusions which are spaced apart from each other, formed on the lower layer, and a filling layer disposed on the uneven pattern, and the upper layer includes at least one of an inorganic film and an organic film.

25 Claims, 3 Drawing Sheets

ORGANIC LIGHT EMITTING DISPLAY DEVICE AND MANUFACTURING METHOD THEREOF

CROSS-REFERENCE TO RELATED APPLICATION

This application claims priority to and the benefit from Korean Patent Application No. 10-2013-0000109, filed on Jan. 2, 2013, with the Korean Intellectual Property Office, the present disclosure of which is incorporated herein in its entirety by reference.

FIELD

The present disclosure relates to an organic light emitting display device and a manufacturing method thereof.

BACKGROUND

An organic light emitting display device is a self-emission display device which has an organic light emitting diode that emits light to display an image. Unlike a liquid crystal display, the organic light emitting display device does not require a separate light source. As such, it is possible to relatively reduce a thickness and a weight thereof, and there are other advantages such as low power consumption, high luminance, and rapid response speed.

The organic light emitting diode display includes a hole injection electrode, an organic emission layer, an electron injection electrode, and a thin film encapsulation layer. In the organic light emitting diode, a hole supplied from the hole injection electrode and an electron supplied from the electron injection electrode are coupled with each other in the organic emission layer to form an exciton, and light is generated by energy generated when the exciton falls to a ground state.

Respective layers included in the organic light emitting display device are made of different materials, and as a result, a difference in the refractive indices between the layers occurs. Total reflection due to the difference in the refractive indices between the layers occurs in the organic light emitting display device, and a part of the light generated in the organic emission layer is restricted due to the internal total reflection and then dissipates.

SUMMARY

Aspects of embodiments of the present invention are directed toward an organic light emitting display device and a manufacturing method thereof capable of increasing light extraction efficiency by disposing an uneven pattern having a plurality of protrusions which are spaced apart from each other in a thin film encapsulation layer.

Aspects of embodiments of the present disclosure are directed toward an organic light emitting display device and a manufacturing method thereof with improved light extraction efficiency by forming an uneven pattern having a plurality of protrusions which are spaced apart from each other in an encapsulation layer to reduce total reflection generated in the organic light emitting display device.

An exemplary embodiment of the present disclosure provides an organic light emitting display device, including: a substrate; a display unit on the substrate; and an encapsulation layer on the display unit, in which the encapsulation layer comprises a lower layer on the display unit, a pattern layer on the lower layer, and an upper layer on the pattern layer, and the lower layer comprises at least one of an inorganic film and an organic film, and the pattern layer comprises an uneven pattern having a plurality of protrusions which are spaced apart from each other, on the lower layer, and a filling layer on the uneven pattern, and the upper layer comprises at least one of an inorganic film and an organic film.

The filling layer may comprise an inorganic layer or an organic layer.

The lower layer may comprise the inorganic film and the organic film, and the organic film and the inorganic film are disposed to alternatively each other.

The lower layer may comprise the organic film.

The lower layer may comprise the inorganic film.

The lower layer may comprise an inorganic film on the display unit and further comprises an organic film on the inorganic film of the lower layer.

The upper layer may comprise the inorganic film and the organic film, and the organic film and the inorganic film are disposed to alternatively each other.

The encapsulation layer may comprise two pattern layers.

The protrusion may have a shape of a cylinder, a prism, a cone, a pyramid, a convex lens, a concave lens, or a square plate extending in one direction.

The display unit may comprise a first electrode on the substrate; an emission layer on the first electrode; and a second electrode on the emission layer.

A capping layer may be between the display unit and the encapsulation layer.

Another exemplary embodiment of the present disclosure provides a manufacturing method of an organic light emitting display device, including: forming a display unit on a substrate; and forming an encapsulation layer on the display unit, in which the forming of the encapsulation layer comprises forming a lower layer on the display unit; forming a pattern layer on the lower layer; and forming an upper layer on the pattern layer, and the forming of the lower layer comprises at least one of forming an inorganic film and forming an organic film, and the forming of the pattern layer comprises forming an uneven pattern having a plurality of protrusions which are spaced apart from each other, on the lower layer, and forming a filling layer on the uneven pattern, and the forming of the upper layer comprises at least one of forming an inorganic film and forming an organic film.

The forming of the filling layer may comprise forming an inorganic layer or forming an organic layer.

The forming of the lower layer may comprise forming the inorganic film and forming the organic film, and the organic film and the inorganic film are formed to alternatively each other.

In the forming of the lower layer, one organic film may be formed on the display unit.

In the forming of the lower layer, one inorganic film may be formed on the display unit.

The forming of the lower layer may comprise forming the inorganic film on the display unit; and forming the organic film on the inorganic film of the lower layer.

The forming of the upper layer may comprise forming the inorganic film and forming the organic film, and the organic film and the inorganic film are formed to alternatively each other.

In the forming of the encapsulation layer may comprise forming the pattern layer is performed twice The forming of the pattern layer may comprise transferring the plurality of protrusions to the lower layer by using a transfer sheet where the plurality of protrusions is disposed.

The transfer sheet may comprise a base part; a thermal release layer on the base part; and a plurality of protrusions on the thermal release layer.

A light-heat conversion layer may be between the base part and the thermal release layer.

The protrusion may have a shape of a cylinder, a prism, a cone, a pyramid, a convex lens, a concave lens, or a square plate extending in one direction.

The forming of the pattern may comprise coating a block copolymer in the lower layer; and aligning polymer blocks to configure a form of the coated block copolymer.

The block copolymer may comprise a PE block, a PI block, a PS block, a PPA block, a PB blocks, or a PMMA block.

According to the exemplary embodiments of the present disclosure, it is possible to improve light extraction efficiency to the outside and reduce power consumption, by disposing an uneven pattern having a plurality of protrusions which are spaced apart from each other in an encapsulation layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
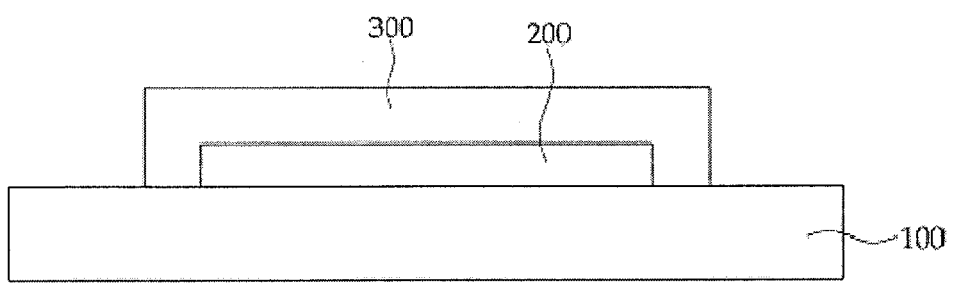
FIG. 1 is a cross-sectional view illustrating an organic light emitting display device according to an exemplary embodiment of the present disclosure.

Hereinafter, exemplary embodiments of the present disclosure will be described in more detail with reference to the accompanying drawings. However, the scope of the present disclosure is not limited to the following Examples and drawings. Exemplary embodiments to be described below and illustrated in the drawings may include various equivalences and modifications.

The terminology used in this specification expresses the exemplary embodiments of the present disclosure and may depend on the intention of users or operators or the custom in the art to which the present disclosure belongs. Accordingly, the terminology needs to be defined based on details throughout this specification.

For reference, respective components and shapes thereof are schematically drawn or exaggeratedly drawn in the accompanying drawings for easy understanding. Like reference numerals designate like elements throughout the drawings.

Further, it will be understood that when a layer or an element is described as being "on" another layer or element, it may be directly disposed on another layer or element, or an intervening layer or element may also be present.

FIG. 1 is a cross-sectional view illustrating an organic light emitting display device according to an exemplary embodiment of the present disclosure.

Referring to FIG. 1, the organic light emitting display device according to an exemplary embodiment of the present disclosure includes a substrate 100, a display unit 200, and an encapsulation layer 300.

The substrate 100 may be made of various suitable materials such as a glass substrate, a quartz substrate, and a transparent resin substrate, and may be formed by using a flexible material. The transparent resin substrate which is usable as the substrate 100 may contain a polyimide resin, an acrylic resin, a polyacrylate resin, a polycarbonate resin, a polyether resin, a polyethylene terephthalate resin, a sulfonic acid resin, and the like.

In the case where the organic light emitting display device is a bottom emission display device that displays light images toward the substrate 100 side, the substrate 100 needs to be made of a light transmitting material, but in the case of a top emission display device that displays light images toward the encapsulation layer 300, the substrate 100 may not be necessarily made of the light transmitting material.

The display unit 200 is an element including an emission layer 220. The detailed configuration will be described below.

The encapsulation layer 300 has a structure in which organic films and inorganic films are alternately laminated.

Figure 2:
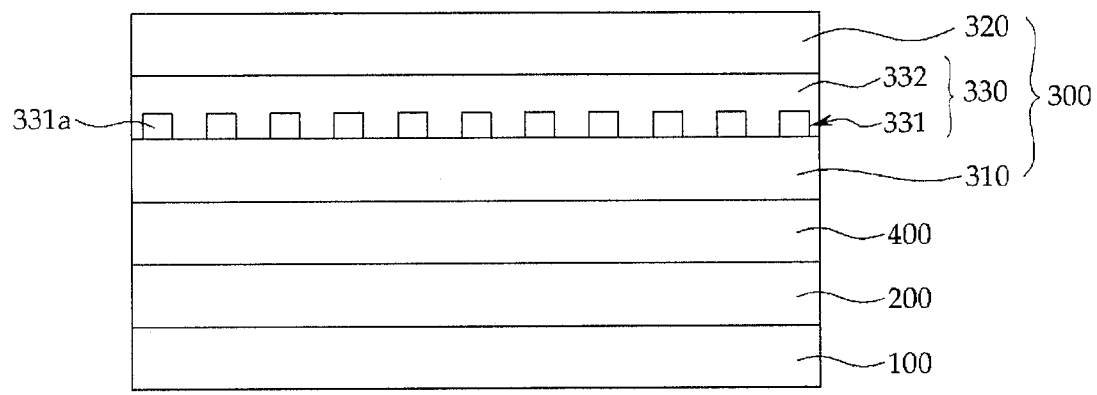
FIG. 2 is a diagram illustrating an organic light emitting display device including an uneven pattern having a plurality of protrusions according to the exemplary embodiment of the present disclosure.

FIG. 2 is a diagram illustrating an organic light emitting display device including an uneven pattern having a plurality of protrusions according to the exemplary embodiment of the present disclosure.

Referring to FIG. 2, the organic light emitting display device according to an exemplary embodiment of the present disclosure includes a substrate 100, a display unit 200 formed on the substrate 100, and an encapsulation layer 300 formed on the display unit 200.

The encapsulation layer 300 may include a lower layer 310 formed on the display unit 200, at least one pattern layer 330 formed on the lower layer 310, and an upper layer 320 formed on the pattern layer 330.

In this case, the lower layer 310 may include at least one of an inorganic film and an organic film.

For example, the lower layer 310 may include at least one inorganic film and at least one organic film, and the organic film and the inorganic film may be disposed to cross or alternatively each other.

The lower layer 310 may be constituted by one organic film by considering external light extraction efficiency. Further, the lower layer 310 may be constituted by one inorganic film.

In addition, the lower layer 310 may include one inorganic film formed on the display unit 200 and one organic film formed on the inorganic film.

The laminated number of organic films and inorganic films may be set by considering external light extraction efficiency and the like.

The upper layer 320 may include at least one of an inorganic film and an organic film, and the organic film and the inorganic film may be disposed to cross each other.

The organic light emitting display device includes the display unit 200 and the encapsulation layer 300 having a multilayered structure, and due to the multilayered structure, there is a problem in that an optical characteristic of the organic light emitting display device deteriorates.

That is, in the multilayered structure including a plurality of inorganic films and a plurality of organic films, there is a problem in that a part of light generated from the emission layer 220 is constrained (restricted) by internal total reflection and then dissipates.

In order to prevent the light extraction efficiency from deteriorating, in the present disclosure, as illustrated in FIG. 2, the pattern layer 330 is included.

The pattern layer 330 may include an uneven pattern 331 having a plurality of protrusions 331a which are spaced apart from each other and a filling layer 332 disposed on the uneven pattern 331, which are formed on the lower layer 310.

The uneven pattern 331 having the plurality of protrusions 331a which are spaced apart from each other may be disposed on at least one of the plurality of inorganic films and the plurality of organic films. Accordingly, the pattern layer 330 may scatter and diffract the light generated from the emission layer 220.

For example, the pattern layer 330 may be disposed on an inorganic film. The inorganic film may be included in the lower layer 310. That is, the lower layer 310 may be constituted by one inorganic film.

The filling layer 332 may include at least one of an inorganic layer and an organic layer.

The organic layer may be made of an organic material and made of the same material as the organic film of the lower layer 310. The inorganic layer may be made of an inorganic material and made of the same material as the inorganic film. Accordingly, at least one of an inorganic layer and an organic layer may be disposed on the pattern 331.

The structure of the upper layer 320 and the filling layer 332 may be configured as follows. When the filling layer 332 is the organic layer, a layer which is first laminated on the organic layer of the filling layer 332 and included in the upper layer 320 may be an inorganic layer. On the contrary, when the filling layer 332 is the inorganic layer, a layer which is first laminated on the inorganic layer of the filling layer 332 and included in the upper layer 320 may be an organic layer. That is, according to the configuration of the filling layer 332, the configuration of the upper layer 320 which is laminated on the filling layer 332 may be changed. In addition, the inorganic film may be formed on the inorganic layer or the organic film may be formed on the organic layer.

Figure 3:
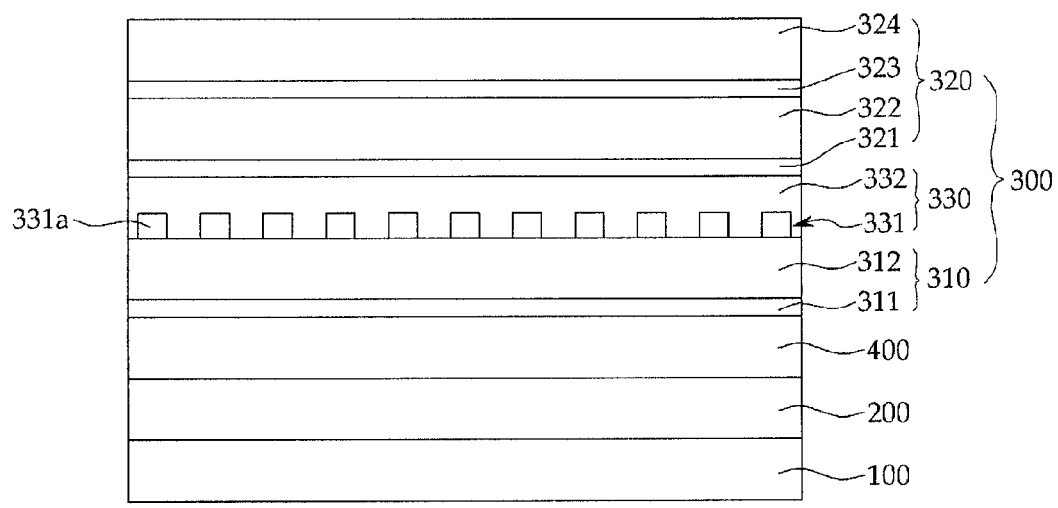
FIG. 3 is a diagram illustrating an organic light emitting display device including an uneven pattern having a plurality of protrusions according to another exemplary embodiment of the present disclosure.

FIG. 3 is a diagram illustrating an organic light emitting display device including an uneven pattern having a plurality of protrusions according to another exemplary embodiment of the present disclosure.

As illustrated in FIG. 3, the lower layer 310 may be constituted by a first inorganic film 311 and a first organic film 312, and the pattern 331 may be disposed on the first organic film 312. Further, the filling layer 332 may be formed on the pattern 331.

The filling layer 332 may be one of an inorganic layer and an organic layer. That is, the first inorganic film 321 may be disposed on the organic layer of the filling layer 332, or the first inorganic film 321 may be disposed on the inorganic layer of the filling layer 332.

In the upper layer 320, a first inorganic film 321 is disposed on the pattern layer 330, a first organic film 322 is disposed on the first inorganic film 321, a second inorganic film 323 is disposed on the first organic film 322, and a second organic film 324 is disposed on the second inorganic film 323.

Figure 4:
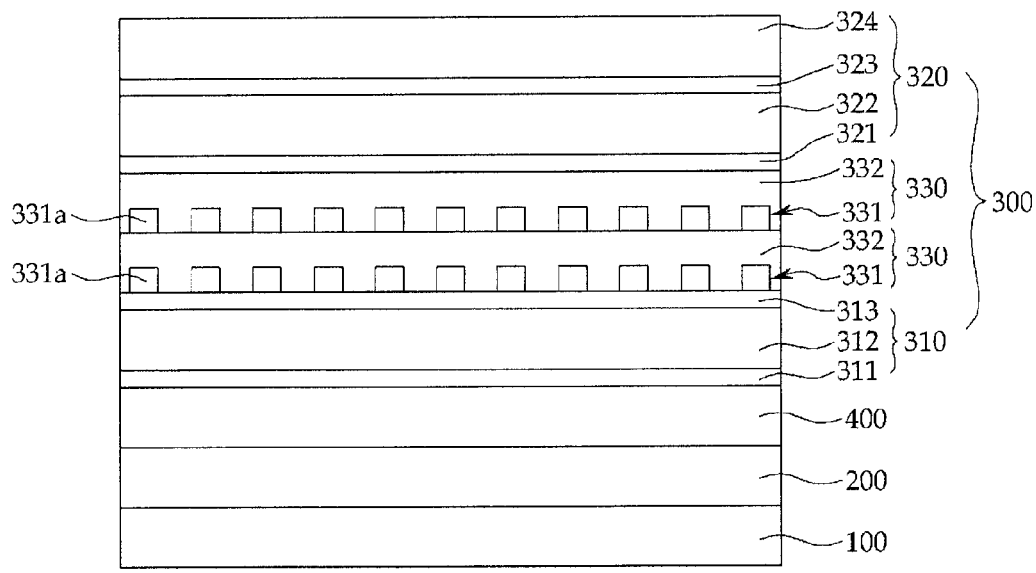
FIG. 4 is a diagram illustrating an organic light emitting display device including an uneven pattern having a plurality of protrusions according to yet another exemplary embodiment of the present disclosure.

FIG. 4 is a diagram illustrating an organic light emitting display device including an uneven pattern having a plurality of protrusions according to yet another exemplary embodiment of the present disclosure.

As illustrated in FIG. 4, the lower layer 310 may include a first inorganic film 311, a first organic film 312, and a second inorganic film 313. The pattern 331 may be disposed on the second inorganic film 313. Further, a filling layer 332 may be formed on the pattern 331. A pattern layer 330 constituted by the pattern 331 and the filling layer 332 may be sequentially formed with two layers or more. For example, after one pattern layer 330 is formed on the lower layer 310, the same pattern layer 330 may be formed again on one pattern layer 330.

The filling layer 332 may be one of an inorganic layer and an organic layer. That is, the first inorganic film 321 may be disposed on the organic layer of the filling layer 332, or the first inorganic film 321 may be disposed on the inorganic layer of the filling layer 332.

In the upper layer 320, a first inorganic film 321 may be disposed on the pattern layer 330, a first organic film 322 may be disposed on the first inorganic film 321, a second inorganic film 323 may be disposed on the first organic film 322, and a second organic film 324 may be disposed on the second inorganic film 323.

Also, the protrusion 331a may have a shape of a cylinder, a prism, a cone, a pyramid, a convex lens, a concave lens, or a square plate extending in one direction.

In addition, suitable thin film materials which are usable as the inorganic films, the organic films, and the filling layer 332, and a laminating method of the inorganic films, the organic films, and the filling layer 332 may be used without particular limitation so long as being known in the art.

The thin film material which is usable as the inorganic film may contain at least one selected from a group constituted by silicon nitride, aluminum nitride, zirconium oxide, titanium nitride, hafnium nitride, tantalum nitride, silicon oxide, aluminum oxide, and titanium oxide.

The thin film material which is usable as the organic layers may contain at least one selected from a group constituted by epoxy, acrylate, urethane acrylate, polyurea, polyacrylate, PTCDA, BPDA, and PMDA.

The thin film material which is usable as the organic film may be used as an organic layer material of the filling layer 332, and the thin film material which is usable as the inorganic film may be used as an inorganic layer material of the filling layer 332.

In addition, inorganic thin film materials or organic thin film materials which are known in the art may be used as the inorganic film or organic film material of the present disclosure.

The inorganic film and the organic film may be formed by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, and the like, according to a material for forming the encapsulation layer 300.

A capping layer 400 may be disposed between the display unit 200 and the encapsulation layer 300, and the capping layer 400 may be made of a transparent material having ultraviolet light absorbing capacity.

Another exemplary embodiment of the present disclosure provides a manufacturing method of the organic light emitting display device. In detail, the manufacturing method may include forming a display unit 200 on a substrate 100, and forming an encapsulation layer 300 on the display unit 200.

The forming of the encapsulation layer 300 may include forming a lower layer 310 on the display unit 200, forming at least one pattern layer 330 on the lower layer 310, and forming an upper layer 320 on the pattern layer 330.

The forming of the lower layer 310 may include at least one of forming an inorganic film and forming an organic film. The organic film and the inorganic film may be formed to cross or alternatively each other.

The lower layer 310 may be formed by one organic film, and the lower layer 310 may be formed by one inorganic film. In addition, the forming of the lower layer 310 may include forming one inorganic film formed on the display unit 200 and forming one organic film formed on the inorganic film.

The forming of the pattern layer 330 may include forming an uneven pattern 331 having a plurality of protrusions 331a which are spaced apart from each other, on the lower layer 310, and forming a filling layer 332 on the uneven pattern 331.

The forming of the filling layer 332 may include at least one of forming an inorganic layer and forming an organic layer.

Also, the forming of the pattern layer 330 may be repeated twice or more, and the encapsulation layer 300 may include two or more pattern layers 330.

The forming of the upper layer 320 may include at least one of forming an inorganic film and forming an organic film. The organic film and the inorganic film may be formed to cross or alternatively each other. For example, as illustrated in FIG. 2, a first inorganic film 321 may be disposed on the pattern layer 330, a first organic film 322 may be disposed on the first inorganic film 321, a second inorganic film 323 may be disposed on the first organic film 322, and a second organic film 324 may be disposed on the second inorganic film 323.

For example, as illustrated in FIG. 3, after forming the substrate 100 and the display unit 200, the lower layer 310 of the encapsulation layer 300 may be first formed on the display unit 200. The lower layer 310 includes or consists of a first inorganic film 311 and a first organic film 312. The first inorganic film 311 and the first organic film 312 may be alternately laminated on the display unit 200. Thereafter, the pattern 331 may be formed on the first organic film 312. In addition, a filling layer 332 may be formed on the pattern 331. The filling layer 332 may be one of an inorganic layer and an organic layer. The upper layer 320 may be formed on the pattern layer 330 including the pattern 331 and the filling layer 332.

Also, as illustrated in FIG. 4, another pattern layer 330 may be further laminated on the pattern layer 330.

In addition, the protrusion 331a may have a shape of a cylinder, a prism, a cone, a pyramid, a convex lens, a concave lens, and a square plate extending in one direction.

According to the exemplary embodiment of the present disclosure, the forming of the uneven pattern 331 may include transferring the plurality of protrusions 331a to the lower layer 310 by using a transfer sheet where the plurality of protrusions 331a is disposed.

The transfer sheet may include a base part, a thermal release layer disposed on the base part, and the plurality of protrusions 331a disposed on the thermal release layer.

A light-heat conversion layer may be disposed between the base part and the thermal release layer.

The base part needs to have transparency in order to transfer light to the light-heat conversion layer and may be made of a material having an optical property and mechanical stability. For example, the base part may be made of one or more polymer materials selected from a group constituted by polyester, polyacryl, polyepoxy, polyethylene, polystyrene, polyethylene terephthalate, glass, and combinations thereof.

In one embodiment, the light-heat conversion layer absorbs light in the infrared to visible light range to convert at least a part of the light to heat, needs to have appropriate optical density, and may include a light absorbing material for absorbing the light. Here, the light-heat conversion layer may be constituted by a metal film made of Al, Ag, and oxide and sulfide thereof, or may be constituted by an organic film made of polymer including carbon black, graphite, or infrared dye.

The thermal release layer is separated from the transfer sheet by thermal energy received form the light-heat conversion layer to be transferred to a set or predetermined substrate. The thermal release layer is transferred to the set or predetermined substrate to become an uneven pattern having a plurality of protrusions.

Meanwhile, a refractive index of the uneven pattern 331 having the plurality of protrusions 331a needs to be different from a refractive index of the filling layer 332 where the pattern 331 is included. The refractive indexes of the pattern 331 and the filling layer 332 where the pattern 331 is included need to be different from each other, and as a result, scattering and diffraction of light generated from the emission layer 220 effectively occur.

Accordingly, in order to make a difference between the refractive indexes, in an example of the present disclosure, the pattern 331 may be constituted by a block copolymer (BCP).

The block copolymer may refer to two or more different monomer blocks that are bound to one chain to form a copolymer. The block copolymer is basically randomly arranged, but when the block copolymer is subjected to solvent annealing or thermal annealing, the block copolymer may be converted into a self assembly. The self assembly may be determined by concentration of polymer blocks configuring the block copolymer.

Hereinafter, a method of forming the pattern 331 according to an exemplary embodiment of the present disclosure by using the block copolymer will be described.

In the exemplary embodiment of the present disclosure, the forming of the pattern 331 may include coating the block polymer in the lower layer 310 and aligning polymer blocks configuring the cured block copolymer.

In more detail, the block copolymer is coated in the lower layer, and thereafter, the coated block copolymer may be cured. In addition, the cured block copolymer is aligned by solvent annealing or thermal annealing.

In the aligned block copolymer, two polymer blocks have self assembly. That is, the two polymer blocks are not irregularly mixed, but respective polymer blocks agglomerate together to be aligned in a stepped or column form.

The aligned shape of the two polymer blocks is not limited to the stepped or column form, but the block copolymer may be divided into two regions having a difference in a refractive index.

Accordingly, since the aligned block copolymer is divided into two regions having a difference in a refractive index, only the block copolymer itself may scatter and diffract the light generated in the emission layer 220.

Also, any one of the two aligned polymer blocks is removed to form unevenness. Thereafter, the other uneven polymer block may be covered by the filling layer 332. Accordingly, due to the difference in a refractive index of the one polymer block and the filling layer 332, the light generated in the emission layer may be scattered and diffracted.

In the case where the filling layer 332 is the inorganic layer, in order to increase the difference in a refractive index between the block copolymer and the inorganic layer, the inorganic layer may use a high refractive index material such as AlOx.

Meanwhile, the block copolymer may include any one of a PE block, a PI block, a PS block, a PPA block, a PB blocks, and a PMMA block.

Figure 5:
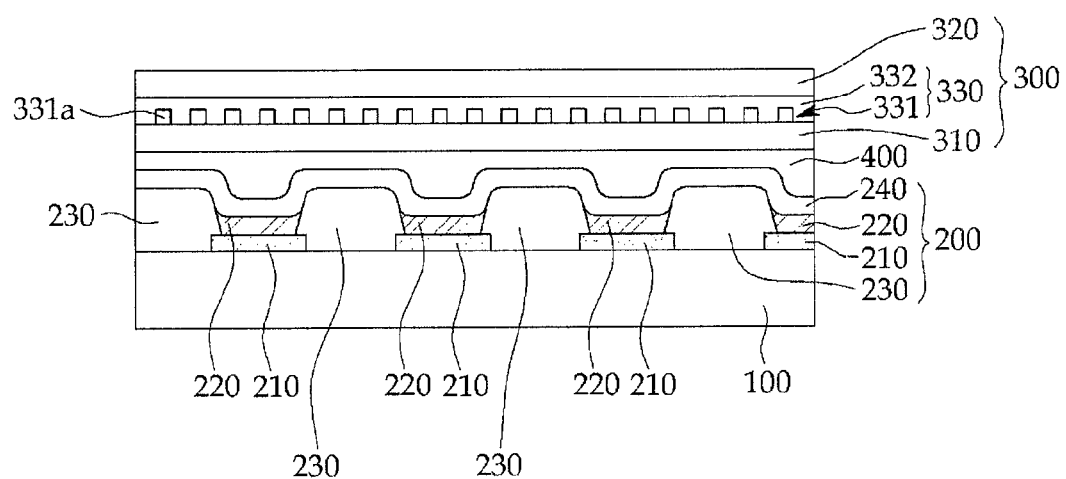
FIG. 5 is a diagram illustrating the organic light emitting display device illustrated in FIG. 2 in more detail.

FIG. 5 is a diagram illustrating the organic light emitting display device illustrated in FIG. 2 in more detail.

The display unit 200 may include a first electrode 210 formed on the substrate 100, a pixel defining layer (PDL) 230 formed between the first electrode 210 and an adjacent first electrode 210, an emission layer 220 formed on the first electrode 210, and a second electrode 240 formed on the emission layer 220.

In the case where the organic light emitting display device is a top emission display device, the first electrode 210 may contain at least one of gold (Au), platinum (Pt), nickel (Ni), tungsten (W), chromium (Cr), molybdenum (Mo), iron (Fe), cobalt (Co), copper (Cu), palladium (Pd), titanium (Ti), and a compound thereof. In addition, the second electrode 240 may contain at least one of indium tin oxide (ITO) and indium zinc oxide (IZO) which are transparent conductive oxides.

In the case where the organic light emitting display device is a bottom emission display device, the first electrode 210 may contain at least one of indium tin oxide (ITO) and indium zinc oxide (IZO) which are transparent conductive oxides having a high work function. In addition, the second electrode 240 may be made of metal having a low work function, that is, alkali metal such as lithium (Li) and cesium (Cs), alkaline earth metal such as magnesium (Mg), calcium (Ca) and strontium (Sr), and a compound thereof.

In addition, the first electrode 210 and the second electrode 240 may contain materials which are known in the art.

The emission layer 220 may include a red emission layer, a green emission layer, and a blue emission layer. The emission layer 220 may be made of a low molecular organic material or a high molecular organic material.

The pixel defining layer 230 is made of a material having an insulation property to partition the first electrodes 210 by a pixel unit. In more detail, the pixel defining layer 230 is disposed at an edge of the first electrode 210 to partition the first electrodes 210 by a pixel unit and define pixel areas. The pixel defining layer 230 covers the edge of the first electrode 210.

As described above, the organic light emitting display device and the manufacturing method thereof are only exemplified, and those skilled in the art can understand that the scope of the present disclosure may include various modifications and equivalent embodiments therefrom.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. An organic light emitting display device, comprising: a substrate; a display unit on the substrate; and an encapsulation layer on the display unit, wherein the encapsulation layer comprises a lower layer on the display unit; a pattern layer on the lower layer; and an upper layer on the pattern layer, the lower layer comprises at least one of an inorganic film and an organic film, the pattern layer comprises an uneven pattern having a plurality of protrusions which extend from a surface of the lower layer toward the upper layer and are spaced apart from each other, at least one of the plurality of protrusions being separated from another one of the plurality of protrusions on the surface of the lower layer, and a filling layer on the uneven pattern, the filling layer separating the plurality of protrusions from the upper layer and covering the plurality of protrusions so that the filling layer fills an entire space between each of the plurality of protrusions and directly contacts the entire surface of the lower layer between each protrusion, the upper layer comprises at least one of an inorganic film and an organic film, and the uneven pattern comprises a block copolymer.

2. The organic light emitting display device of claim 1, wherein the filling layer comprises an inorganic layer or an organic layer.

3. The organic light emitting display device of claim 1, wherein the lower layer comprises the inorganic film and the organic film, and the organic film and the inorganic film are disposed to alternatively each other.

4. The organic light emitting display device of claim 1, wherein the lower layer comprises the organic film.

5. The organic light emitting display device of claim 1, wherein the lower layer comprises the inorganic film.

6. The organic light emitting display device of claim 1, wherein the lower layer comprises the inorganic film on the display unit and further comprises the organic film on the inorganic film of the lower layer.

7. The organic light emitting display device of claim 1, wherein the upper layer comprises the inorganic film and the organic film, and the organic film and the inorganic film are disposed to alternatively each other.

8. The organic light emitting display device of claim 1, wherein the encapsulation layer comprises two pattern layers.

9. The organic light emitting display device of claim 1, wherein the protrusion has a shape of a cylinder, a prism, a cone, a pyramid, a convex lens, a concave lens, or a square plate extending in one direction.

10. The organic light emitting display device of claim 1, wherein the display unit comprises a first electrode on the substrate; an emission layer on the first electrode; and a second electrode on the emission layer.

11. The organic light emitting display device of claim 1, wherein a capping layer is between the display unit and the encapsulation layer.

12. A manufacturing method of an organic light emitting display device, the manufacturing method comprising: forming a display unit on a substrate; and forming an encapsulation layer on the display unit, wherein the forming of the encapsulation layer comprises forming a lower layer on the display unit; forming a pattern layer on the lower layer; and forming an upper layer on the pattern layer, the forming of the lower layer comprises at least one of forming an inorganic film and forming an organic film, and the forming of the pattern layer comprises forming an uneven pattern having a plurality of protrusions which extend from a surface of the lower layer toward the upper layer and are spaced apart from each other, at least one of the plurality of protrusions being separated from another one of the plurality of protrusions on the surface of the lower layer using a block copolymer, and forming a filling layer on the uneven pattern, the filing layer separating the plurality of protrusions from the upper layer and covering the plurality of protrusion so that the filling layer fills an entire space between each of the plurality of protrusions and directly contacts the entire surface of the lower layer between each protrusion, and the forming of the upper layer comprises at least one of forming an inorganic film and forming an organic film.

13. The manufacturing method of claim 12, wherein the forming of the filling layer comprises forming an inorganic layer or forming an organic layer.

14. The manufacturing method of claim 12, wherein the forming of the lower layer comprises forming the inorganic film and forming the organic film, and the organic film and the inorganic film are formed to alternatively each other.

15. The manufacturing method of claim 12, wherein in the forming of the lower layer, the organic film is formed on the display unit.

16. The manufacturing method of claim 12, wherein in the forming of the lower layer, the inorganic film is formed on the display unit.

17. The manufacturing method of claim 12, wherein the forming of the lower layer comprises forming the inorganic film on the display unit; and forming the organic film on the inorganic film of the lower layer.

18. The manufacturing method of claim 12, wherein the forming of the upper layer comprises forming the inorganic film and forming the organic film, and the organic film and the inorganic film are formed to alternatively each other.

19. The manufacturing method of claim 12, wherein in the forming of the encapsulation layer comprises forming the pattern layer is performed twice.

20. The manufacturing method of claim 12, wherein the forming of the pattern layer comprises transferring the plurality of protrusions to the lower layer by using a transfer sheet where the plurality of protrusions is disposed.

21. The manufacturing method of claim 20, wherein the transfer sheet comprises a base part; a thermal release layer on the base part; and a plurality of protrusions on the thermal release layer.

22. The manufacturing method of claim 21, wherein a light-heat conversion layer is between the base part and the thermal release layer.

23. The manufacturing method of claim 12, wherein the protrusion has a shape of a cylinder, a prism, a cone, a pyramid, a convex lens, a concave lens, or a square plate extending in one direction.

24. The manufacturing method of claim 12, wherein the forming of the pattern comprises coating a block copolymer in the lower layer; and aligning polymer blocks to configure a form of the coated block copolymer.

25. The manufacturing method of claim 24, wherein the block copolymer comprises a PE block, a PI block, a PS block, a PPA block, a PB blocks, or a PMMA block.

* * * * *